US006494779B1

(12) United States Patent
Nicolai et al.

(10) Patent No.: US 6,494,779 B1
(45) Date of Patent: Dec. 17, 2002

(54) CONTROL CABINET WITH COOLING DEVICE

(75) Inventors: Walter Nicolai, Buseck; Adam Pawlowski, Eschenburg-Wissenbach, both of (DE)

(73) Assignee: Rittal-Werk Rudolf Loh GmbH & Co. KG, Herborn (DE)

( * ) Notice: Subject to any disclaimer, the term of this patent is extended or adjusted under 35 U.S.C. 154(b) by 0 days.

(21) Appl. No.: 09/601,757

(22) PCT Filed: Dec. 16, 1998

(86) PCT No.: PCT/EP98/08234

§ 371 (c)(1),
(2), (4) Date: Aug. 7, 2000

(87) PCT Pub. No.: WO99/40657

PCT Pub. Date: Aug. 12, 1999

(30) Foreign Application Priority Data

Feb. 7, 1998 (DE) .......................... 198 04 902

(51) Int. Cl.[7] ................................ H05K 5/00
(52) U.S. Cl. ...................... 454/184; 361/605; 174/16.1
(58) Field of Search ............................... 454/184, 185; 174/16.1; 237/46; 361/605

(56) References Cited

U.S. PATENT DOCUMENTS

| 3,120,166 | A | * | 2/1964 | Lyman ........................ 454/184 |
|---|---|---|---|---|
| 3,559,728 | A | * | 2/1971 | Lyman ........................ 454/184 |
| 4,592,602 | A | | 6/1986 | Kuster et al. |
| 4,648,007 | A | * | 3/1987 | Garner ........................ 361/384 |
| 4,840,225 | A | * | 6/1989 | Foley et al. ............ 165/104.33 |
| 5,150,277 | A | * | 9/1992 | Bainbridge et al. ......... 361/384 |
| 5,467,250 | A | * | 11/1995 | Howard et al. ............. 361/696 |

FOREIGN PATENT DOCUMENTS

| DE | 41 11 457 C1 | 10/1991 | |
|---|---|---|---|
| DE | 41 35 894 C1 | 11/1992 | |
| DE | 19531310 A1 | * 2/1997 | .................. 454/184 |

* cited by examiner

Primary Examiner—Harold Joyce
Assistant Examiner—Derek S. Boles
(74) Attorney, Agent, or Firm—Pauley Petersen Kinne & Erickson

(57) ABSTRACT

A control cabinet with a frame having framing profiles and covered with side members and at least one door. The frame surrounds the inside of the control cabinet where electrical components are integrated. An air conditioning device which is placed on at least one vertical side of the frame rejects heat generated inside the control cabinet. This invention provides this type of cooling apparatus with additional equipment without the need for a large number of pieces. For this purpose, a separating member, parallel to the lateral side and placed at a distance therefrom, is attached to the framing profiles and forms with the side channel an air guiding channel. Moreover, the separating member comprises several passages for providing a physical connection between the air guiding channel and the inside of the control cabinet. Furthermore, air can be conveyed through the air guiding channel and through at least one passage by using at least one fan.

10 Claims, 3 Drawing Sheets

CONTROL CABINET WITH COOLING DEVICE

BACKGROUND OF THE INVENTION

1. Field of the Invention

This invention relates to a switchgear cabinet with a rack, assembled from profiled frame sections and paneled with lateral elements and at least one cabinet door, and which encloses a switchgear cabinet interior, in which electrical installations are housed, and wherein in an area of at least one vertical side of the rack a cooling device is arranged which removes heat generated in the switchgear cabinet interior.

2. Description of Related Art

A conventional switchgear cabinet is known from German Patent Reference DE 41 11 457 C1. The rack of the switchgear cabinet is assembled from twelve equal profiled frame sections. The sides of the rack are paneled with vertical lateral elements. The switchgear cabinet can be refurbished with a cooling device. Thus, a lateral element is removed from the rack and a cooling device is screwed to the vertical profiled frame section in its place. The cooling device encloses an interior chamber, in which the cooling units are housed. It is possible to aspirate air from the switchgear cabinet interior into the interior chamber, to cool the air there and then to return the air into the switchgear cabinet interior.

SUMMARY OF THE INVENTION

It is one object of this invention to provide a switchgear cabinet of the type mentioned at the outset, in which refurbishing with an airconditioning device is possible with a small outlay of parts.

This object of this invention is attained with a separating element fastened on the profiled frame sections and distanced parallel in relation to the lateral element which, together with the lateral element, forms an air guide conduit and which has several openings which create a spatial connection of the air guide conduit with the switchgear cabinet interior. It is possible to convey air through the air guide conduit and at least one opening with at least one ventilator.

For refurbishing the switchgear cabinet, the lateral element becomes a component of the airconditioning device, so that the latter need not be exchanged. This simple step considerably reduces the structural outlay for a cooling device. Moreover, if a separating element is installed in the interior of the switchgear cabinet, the exterior appearance of the switchgear cabinet is not, or is only negligibly, affected.

For a simplified assembly the openings cut in a vertical wall of the separating element are arranged symmetrically distributed with respect to the horizontally and/or vertically extending center transverse plane of the separating element.

In a preferred embodiment of this invention the separating element has at least two rows of openings, which are evenly distanced from each other. One of the rows is arranged in the bottom area and the second row in the cover area of the interior chamber. The heated air collected in the cover area can be aspirated through the upper openings, cooled in the airconditioning device and then re-introduced into the switchgear cabinet through the openings in the bottom area. At least one further row of openings can be arranged in the center area between the bottom and cover areas of the switchgear cabinet interior, in order to thus provide further introduction or removal options of air into, or respectively out of, the air guide channel.

In a preferred embodiment, the openings can be closed off independently of each other by covers. This makes it possible for the user to use existing openings of a present airconditioning device, which in the particular case are suitable for effective cooling. The openings not required are simply closed off by the covers. For example, the covers can be designed as plate-like elements, which are suspended by hooks on the separating element and are secured to the separating element with a fastening element.

In order to make the air conveyance in the guide conduit possible in a simple manner, the ventilators are arranged in the area of one or several openings, which aspirate the air conveyed in the guide conduit through the opening out of the switchgear cabinet interior, or discharge into it. In this case, the ventilators are primarily arranged on the side of the separating element facing the switchgear cabinet interior.

It is thus possible to place the separating element closely against the lateral element, so that a space-saving construction is possible.

This invention is explained in greater detail by an embodiment shown in the drawings, wherein.

DESCRIPTION OF PREFERRED EMBODIMENTS

Figure 1:
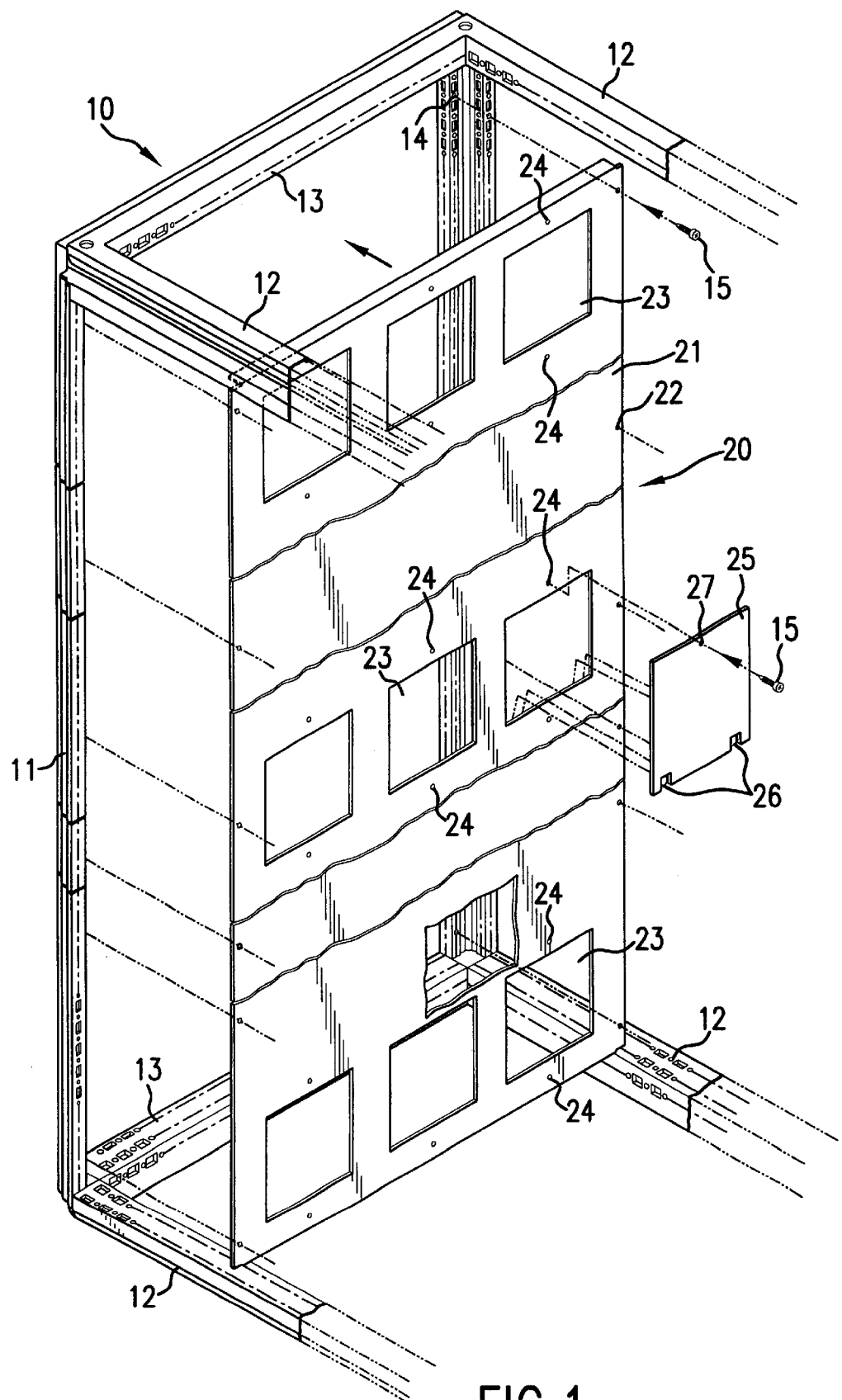
FIG. 1 shows a rack of a switchgear cabinet and a separating element fastened thereon, in a perspective exploded view.

A rack 10, which is assembled from vertical and horizontal profiled frame sections 11, 12 and 13, is shown in FIG. 1. In this case the horizontal profiled frame sections 12, 13 are designed as depth and width struts and are assembled to form a bottom and a cover frame. The bottom and the cover frame can be connected with each other by means of the vertical profiled frame sections 11. The vertical profiled frame sections 11 have four profiled sides, which are oriented toward the interior of the rack 10. These profiled sides have rows of fastening receivers 14, spaced apart at even distances from each other. Respectively, two profiled sides per vertical profiled frame section 11 are assigned to each side of the rack 10, wherein one of the profiled sides extends parallel with the associated side. A separating element 20 can be fastened on the profiled sides of two adjoining vertical profiled frame sections 11, which extend parallel with the side of the rack 10. The separating element 20 essentially has a vertical wall 21, which has horizontal bevels on its upper and lower side. Three rows of respectively three openings 23 are cut into the wall 21. In this case the square openings are arranged in the upper, the lower and the center areas of the wall 21. Two screw receptacles 24 are associated with each opening 23. Here, the screw receptacles 24 are cut into the wall 21 in the area of facing sides of the square openings 23. As shown in FIG. 1, the separating element is designed symmetrically with respect to the horizontally and vertically extending center transverse plane of the wall 21. Bores 22 are in the area of the vertical sides of the wall 21 for fastening the separating element 20. The bores 22 can be arranged aligned with fastening receptacles 14 of the vertical profiled frame sections 11. The separating element 20 can be screwed to the vertical profiled frame sections 11 by means of fastening elements 15.

Covers 25 close one or several openings 23. The covers 25 are embodied as rectangular, plate-shaped elements. In the area of one side, the covers 25 have stamped-out hooks 26. A bore 27 is cut into the cover 25 on the side opposite the hooks 26. For closing off an opening, the cover 25 can be suspended in the wall 21 with a hook 26. It is then possible to introduce a fastening element 15 through the bore 27 and to screw it into the screw receptacle 24.

Figure 2:
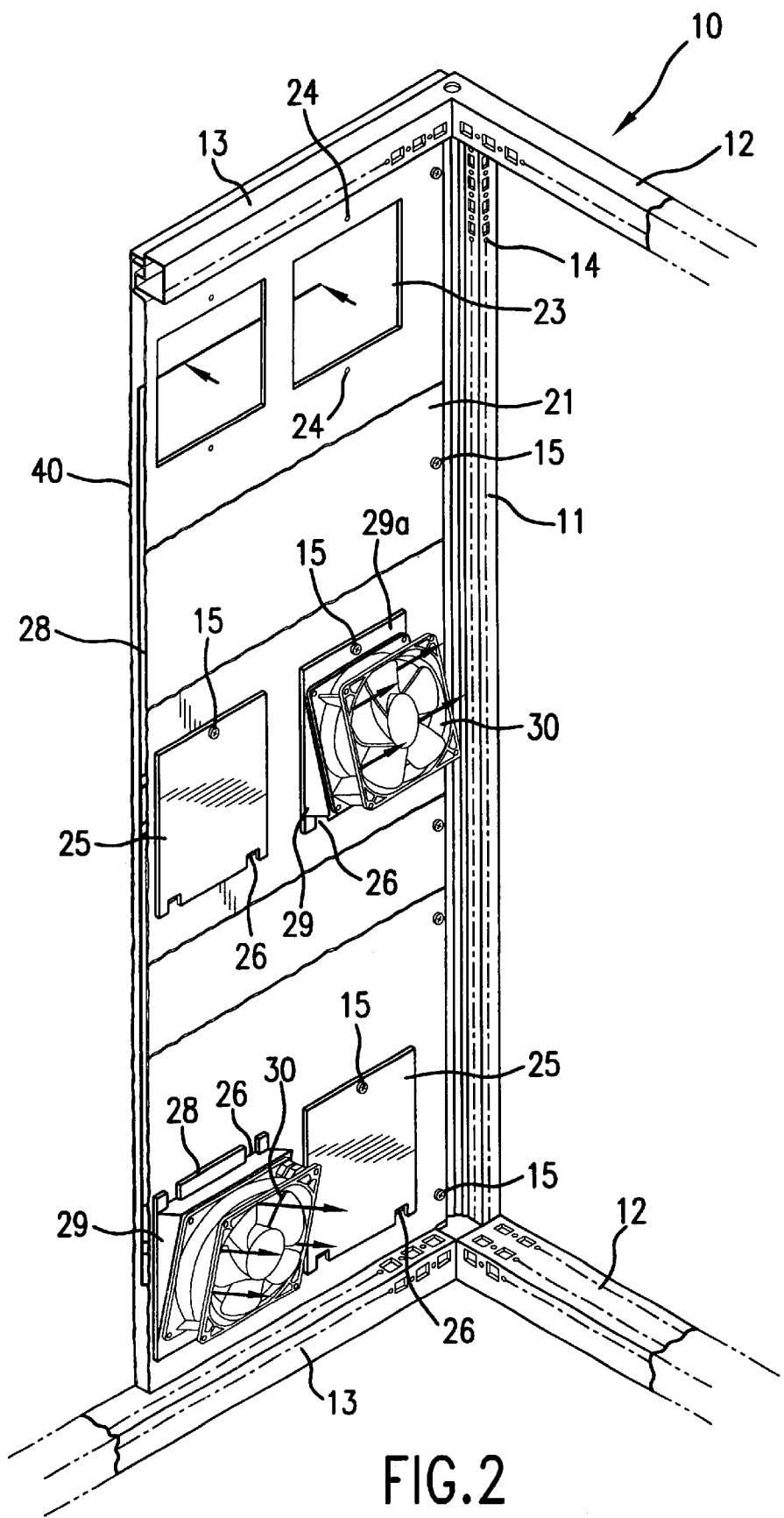
FIG. 2 shows an air conditioning device, embodied as a cooling device and fastened on the rack, in a partial view.

A possible application of the cooling device represented in FIG. 1 is shown in FIG. 2. Here, the openings 23 of the lower and the center rows of openings 23 are closed by means of covers 25. Only one of the openings 23 remains uncovered. A ventilator 30 is fastened in the area of this uncovered opening 23. The ventilator 30 is fastened on a pedestal 29, which is supported by a holder 29a. The holder 29a also has hook elements 26, by means of which it can be suspended in the wall 21 and thereafter fixed in place in the appropriate screw receptacle 24 by means of a fastening element 15.

As shown in FIG. 2, a lateral element 40 is fastened on the exterior of the rack 10. In this case the lateral element 40 is arranged at a parallel distance with respect to the wall 21 of the separating element 20. An air guide conduit 28 is thus formed between the lateral element 40 and the separating element 20.

Air can be aspirated from the air guide conduit 28 by the ventilators 30 and blown into the interior of the switchgear cabinet. The openings 23 which are arranged in the upper area of the wall 21 provide a spatial connection between the switchgear cabinet interior and the air guide conduit 28. Thus, heated air can be aspirated out of the switchgear cabinet interior through the openings 23.

Figure 3:
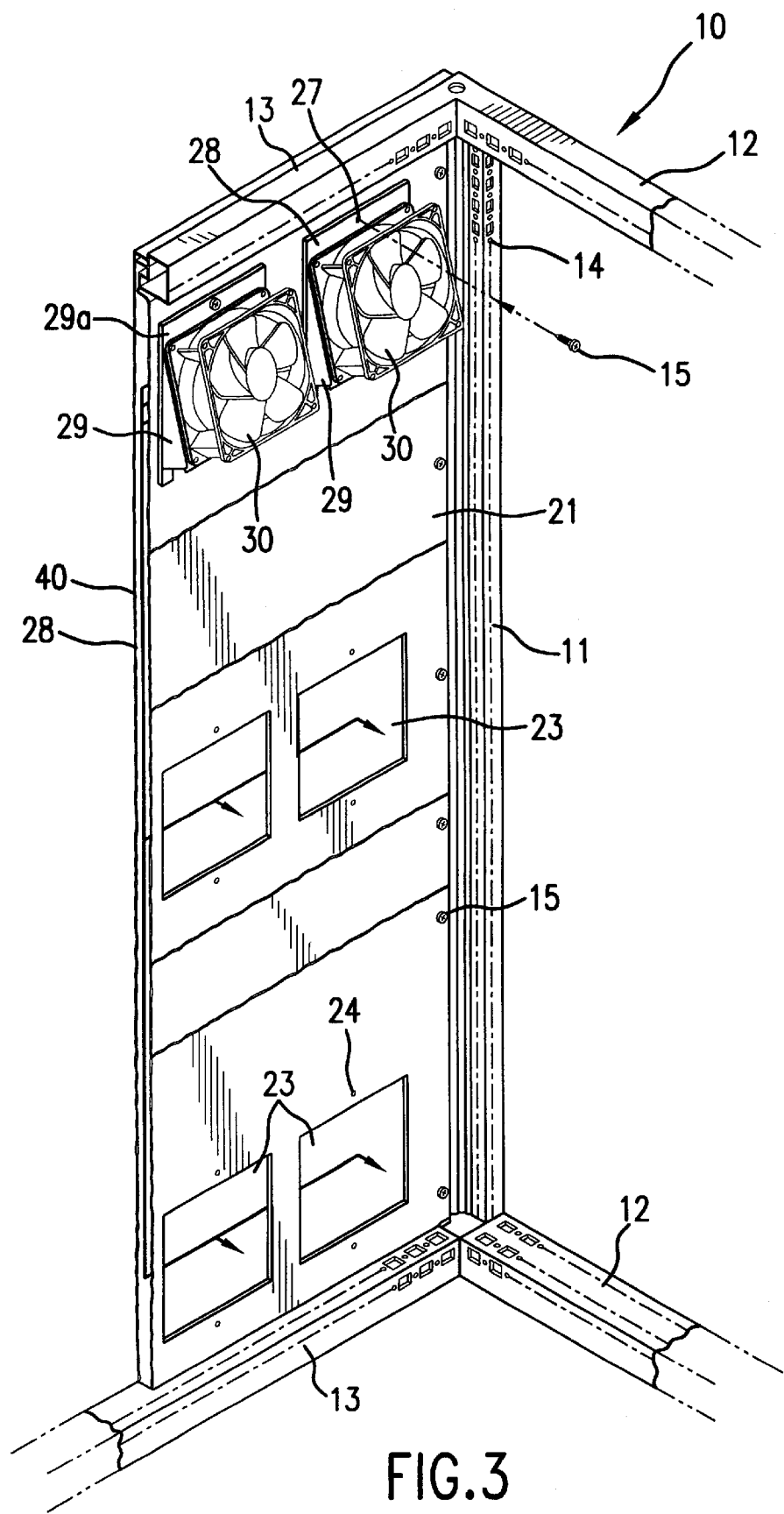
FIG. 3 shows the cooling device of FIG. 2, but in a different construction.

A further application of the cooling device in accordance with this invention is shown in FIG. 3. As shown, the openings 23 arranged at the top of the wall 21 are each equipped with a ventilator 30. The remaining openings 23 of the separating element 20 remain uncovered. The heated air can be aspirated by means of the ventilators in the cover area of the switchgear cabinet and blown into the air guide conduit 28.

With the cooling devices in accordance with this invention, the lateral element 40 forms a heat exchanger, by means of which the heat energy of the aspirated air can be released to the surroundings.

The air cooled in this manner then leaves the air guide conduit 28 through the unclosed openings 23 and returns into the interior of the switchgear cabinet.

What is claimed is:

1. In a switchgear cabinet with a rack assembled from profiled frame sections and paneled with lateral elements and at least one cabinet door, which encloses a switchgear cabinet interior in which electrical installations are housed, and wherein in an area of at least one vertical side of the rack a cooling device is arranged, which removes heat generated in the switchgear cabinet interior, the improvement comprising:

a separating element (20) fastened on the profiled frame sections (11) and distanced parallel relative to the one of lateral elements (40) which with the one lateral element (40) forms an air guide conduit (28);

the separating element (20) having a plurality of openings (23) which create a spatial connection of the air guide conduit (28) with the switchgear cabinet interior;

at least one ventilator (30) for conveying air through the air guide conduit (28) and at least one opening (23); and each of the at least one opening (23) closed off independently of each other by covers (25).

2. In the switchgear cabinet in accordance with claim 1, wherein the openings (23) are cut in a vertical wall (21) of the separating element (20) and are arranged symmetrically distributed with respect to at least one of a horizontally and a vertically extending center transverse plane of the separating element (20).

3. In the switchgear cabinet in accordance with claim 2, wherein the separating element (20) has at least two rows of openings (23) evenly distanced from each other, and one of the rows is arranged in a bottom area and another of the rows is arranged in a cover area of the switchgear cabinet interior.

4. In the switchgear cabinet in accordance with claim 3, wherein at least one further row of openings (23) is arranged in a center area between the bottom area and the cover area of the switchgear cabinet interior.

5. In the switchgear cabinet in accordance with claim 4, wherein the covers (25) are designed as plate-like elements which are suspended by hooks (26) on the separating element (20) and are secured to the separating element (20) with a fastening element (15).

6. In the switchgear cabinet in accordance with claim 5, wherein ventilators (30) are arranged in an area of the at least one opening (23) and aspirate the air conveyed in the guide conduit (28) through the at least one opening (23).

7. In the switchgear cabinet in accordance with claim 1, wherein the separating element (20) has at least two rows of openings (23) evenly distanced from each other, and one of the rows is arranged in a bottom area and another of the rows is arranged in a cover area of the switchgear cabinet interior.

8. In the switchgear cabinet in accordance with claim 7, wherein at least one further row of openings (23) is arranged in a center area between the bottom area and the cover area of the switchgear cabinet interior.

9. In the switchgear cabinet in accordance with claim 1, wherein the covers (25) are designed as plate-like elements which are suspended by hooks (26) on the separating element (20) and are secured to the separating element (20) with a fastening element (15).

10. In the switchgear cabinet in accordance with claim 1, wherein ventilators (30) are arranged in an area of the at least one opening (23) and aspirate the air conveyed in the guide conduit (28) through the at least one opening (23).

* * * * *